United States Patent
Clark

(10) Patent No.: US 9,445,160 B2
(45) Date of Patent: Sep. 13, 2016

(54) LEGACY CONVERTER FILTER WITH EXTENDED FREQUENCY RANGE

(71) Applicant: Eagle Comtronics, Inc., Liverpool, NY (US)

(72) Inventor: Gary John Clark, Constantia, NY (US)

(73) Assignee: Eagle Comtronics, Inc., Liverpool, NY (US)

( * ) Notice: Subject to any disclaimer, the term of this patent is extended or adjusted under 35 U.S.C. 154(b) by 0 days.

(21) Appl. No.: 14/738,415

(22) Filed: Jun. 12, 2015

(65) Prior Publication Data
US 2015/0365732 A1 Dec. 17, 2015

Related U.S. Application Data

(60) Provisional application No. 62/011,313, filed on Jun. 12, 2014.

(51) Int. Cl.
*H04N 7/173* (2011.01)
*H04N 21/61* (2011.01)
*H04B 3/14* (2006.01)
*H03H 7/075* (2006.01)
*H03H 7/01* (2006.01)

(52) U.S. Cl.
CPC .......... *H04N 21/6168* (2013.01); *H03H 7/075* (2013.01); *H03H 7/1758* (2013.01); *H03H 7/1766* (2013.01); *H03H 7/1791* (2013.01); *H04B 3/14* (2013.01); *H03H 2240/00* (2013.01); *H04N 21/6118* (2013.01)

(58) Field of Classification Search
CPC ... H04N 7/102; H04N 7/17309; H04N 7/104
USPC ............... 725/127, 128, 131, 132, 139, 140, 725/149–152
See application file for complete search history.

(56) References Cited

U.S. PATENT DOCUMENTS

| | | | | |
|---|---|---|---|---|
| 4,577,168 A * | 3/1986 | Hartmann | ............ | H03H 9/6409 333/170 |
| 5,030,934 A * | 7/1991 | Kinsman | ................ | H03H 9/542 333/188 |
| 5,625,863 A * | 4/1997 | Abraham | ................ | H04B 1/707 348/E7.05 |
| 6,160,571 A * | 12/2000 | Wang | ....................... | H04B 1/40 348/725 |
| 6,344,749 B1 * | 2/2002 | Williams | .............. | H05K 9/0069 324/620 |
| 6,553,216 B1 * | 4/2003 | Pugel | ....................... | H03D 7/18 455/195.1 |
| 6,737,935 B1 * | 5/2004 | Shafer | ....................... | H01P 1/20 333/132 |
| 7,603,275 B2 * | 10/2009 | Tavares | ................... | G10L 17/06 704/246 |
| 7,720,454 B1 * | 5/2010 | Clement | .............. | H04B 1/0032 375/340 |
| 7,941,091 B1 * | 5/2011 | Doherty | ................. | H04H 40/90 455/272 |
| 8,041,222 B2 * | 10/2011 | Lee | .................. | H04B 10/25758 370/503 |
| 2005/0283815 A1* | 12/2005 | Brooks | ................... | H04H 20/78 725/126 |
| 2008/0157898 A1* | 7/2008 | Palinkas | .............. | H03H 7/0115 333/110 |
| 2008/0227409 A1* | 9/2008 | Chang | .................... | H04B 1/525 455/78 |
| 2012/0025929 A1* | 2/2012 | Muterspaugh | ......... | H03H 7/461 333/126 |
| 2012/0212305 A1* | 8/2012 | Shafer | .................. | H03H 7/0153 333/174 |

* cited by examiner

*Primary Examiner* — Annan Shang
(74) *Attorney, Agent, or Firm* — Woods Oviatt Gilman LLP; Katherine H. McGuire, Esq.

(57) ABSTRACT

The present invention provides a converter filter that includes a bandstop frequency range to protect against overloading of the input circuits of legacy converter boxes from the relatively high power upstream return path signal between 5 and 85 MHz. The converter filter also functions to pass the downstream signal path with minimal loss and reflection. The converter filter comprises a circuit including a low pass filter and high pass filter in parallel with each other that operate to substantially pass signals in a first frequency band of approximately 5 to 52 MHz and a second frequency band of approximately 85 MHz to 2 GHz while substantially blocking signals in a third frequency band of approximately 52 MHz to 85 MHz.

21 Claims, 21 Drawing Sheets

LEGACY CONVERTER FILTER WITH EXTENDED FREQUENCY RANGE

BACKGROUND OF THE INVENTION

The present invention relates to legacy converter filters, and more particularly relates to a legacy converter filter that includes a bandstop filter portion to protect the input circuits of the legacy converter boxes.

Data Over Cable Service Interface Specification (DOCSIS) is an international telecommunications standard that permits the addition of high-speed data transfer to an existing cable TV (CATV) system. It is employed by many cable television operators to provide Internet access over their existing hybrid fiber-coaxial (HFC) infrastructure. In many instances DOCSIS is used to provide video content as well as Internet connectivity and telephone service.

As cable companies migrate from earlier versions of DOCSIS (Data Over Cable Service Interface Specification) to DOCSIS 3 and above, the bandwidth requirement for digital services is ever increasing. This is the case especially in the return band (i.e. upstream band) which in prior versions of DOCSIS such as version 3.0 was limited to the band below 42 MHz. The upstream return band frequency band in DOCSIS 3.0 modems is 5 to 42 MHz. The DOCSIS 3.1 standard moves the upper return band frequency from 42 MHz to 85 MHz in the United States and up to 200 MHz in countries outside the United States.

An issue created when increasing the return path upper frequency is the reuse of the frequency band from 42 to 85 MHz, which is utilized in the United States for channels 2 through 6 on TV set top boxes.

A problem thus arises in that legacy converter boxes that receive channels 2 through 6 are now over driven by the higher signal level produced by the DOCSIS 3.1 equipment return path signals. The higher output DOCSIS 3.1 signals overdrive (i.e. overload) the input tuner of the legacy converter boxes.

Cable companies are also concerned about the insertion loss and return loss in the forward band, 54 MHz to 2 GHz and in some cases 3 GHz. This can affect the quality of service for internet and digital channels. Currently the requirement for having good quality service is from 54 MHz to 1002 MHz and is considered to be normal in the industry. Increasing the upper frequency limit to 2000 MHz allows the cable operators to offer more services on an already cramped system.

There is thus a need for a converter filter that overcomes the problems described supra. In particular, there is a need for a converter filter that includes a bandstop filter portion to protect the input circuits of the legacy converter boxes. The legacy converter filter should also function to pass the forward path (54 MHz to 2 GHz) with minimal loss and reflection.

SUMMARY OF THE INVENTION

The present invention overcomes the problems of prior art filters by providing a converter filter that includes a bandstop frequency range to protect the input circuits of legacy converter boxes. The converter filter also functions to pass both the forward and reverse signal paths with minimal loss and reflection. More particularly, in one aspect, the invention comprises a filter circuit that operates to substantially pass signals between a plurality of frequency bands and block frequencies in another frequency band. The legacy converter filter comprises a circuit that operates to substantially pass signals in a first frequency band of approximately 5 to 52 MHz and in a second frequency band of approximately 85 MHz to 2 GHz, and to substantially block signals in a third frequency band of approximately 52 MHz to 85 MHz.

In one embodiment of this invention, the circuit comprises a low pass filter and a high pass filter having a plurality of capacitors and inductors. In another embodiment, the circuit comprises a plurality of capacitors operatively connected to a plurality of inductors and each capacitor being connected to ground. In a further embodiment, the circuit comprises a first set of capacitors operatively connected to a second set of capacitors and each capacitor of the first set of capacitors being connected in series to a inductor and ground. In this embodiment, or a similar embodiment, a resistor is operatively connected in series to the first set of capacitors. Also in this embodiment, or a similar embodiment, a plurality of resistors is operatively connected to the first set of capacitors. Also in this embodiment, or a similar embodiment, a capacitor of the first set of capacitors is configured to be in parallel with an inductor. Also in this embodiment, or a similar embodiment, a capacitor of the first set of capacitors is further in series with a resistor that is in parallel with an inductor. Also in this embodiment, or a similar embodiment, a capacitor of the first set of capacitors is in series with a resistor that is in parallel with an inductor. In yet a further embodiment, a resistor is added at the input and the output of the legacy converter filter. In yet a further embodiment, a resistor is added at the output of the legacy converter filter.

DETAILED DESCRIPTION OF PREFERRED EMBODIMENTS

The present invention provides a converter filter that includes a bandstop frequency range to protect against overloading of the input circuits of legacy converter boxes from the relatively high power upstream return path signal between 5 and 85 MHz. The converter filter also functions to pass the downstream signal path with minimal loss and reflection.

It is well known in the cable industry that impedance, Second Resonant Frequency (SRF), fringing capacitance, etc., limit the performance of the system at higher frequencies. The converter filter of the present invention improves performance by removing four circuit elements and replacing one or two of them with resistor values from 0 to 75 Ohm resulting in a significant improvement in insertion and return loss. By adding the resistances to one leg of the filter a better match between the two branches and the input and/or output are achieved. The same is true when the components on the input side are changed in similar fashion.

Figure 21:
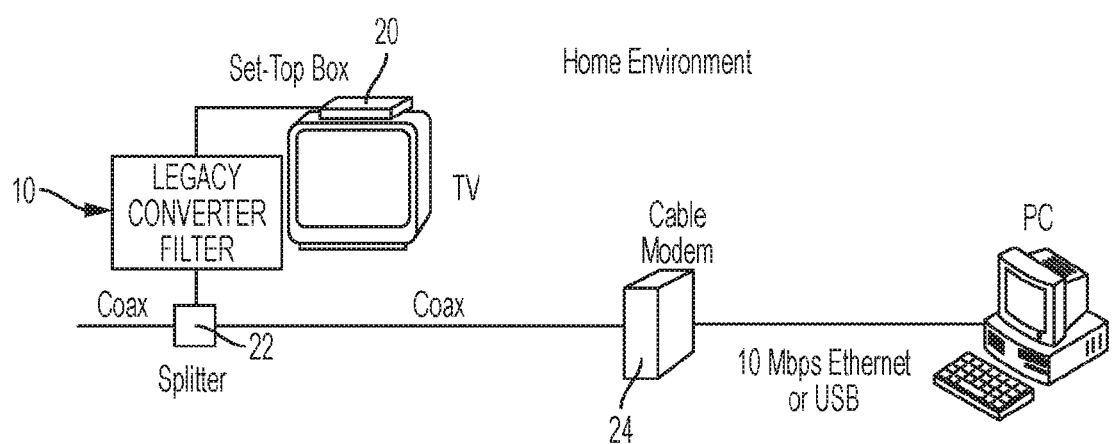
FIG. 21 shows a typical home cable network environment.

With reference to FIG. 21, in one embodiment, the legacy converter filter 10 is placed downstream from any coax splitters 22 but before any legacy converter boxes, i.e. TV set top boxes 20. Since the path to DOCSIS 3.1 cable modems 24 cannot be blocked, the filter is preferably placed in front of the legacy converter boxes they are meant to protect as opposed to other upstream or downstream locations.

Figure 1:
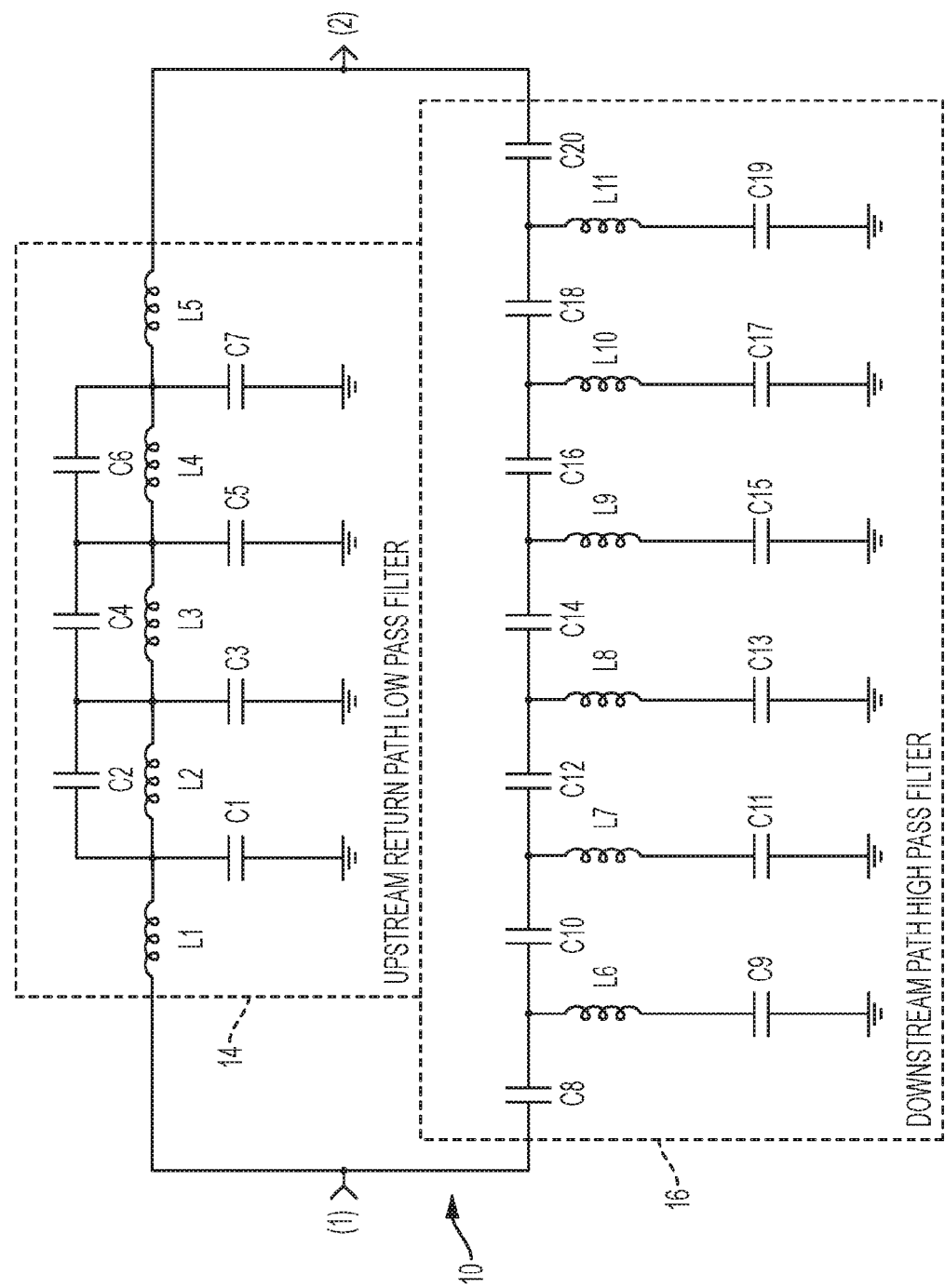
FIG. 1 illustrates a first embodiment of the legacy converter filter.
Figure 2:
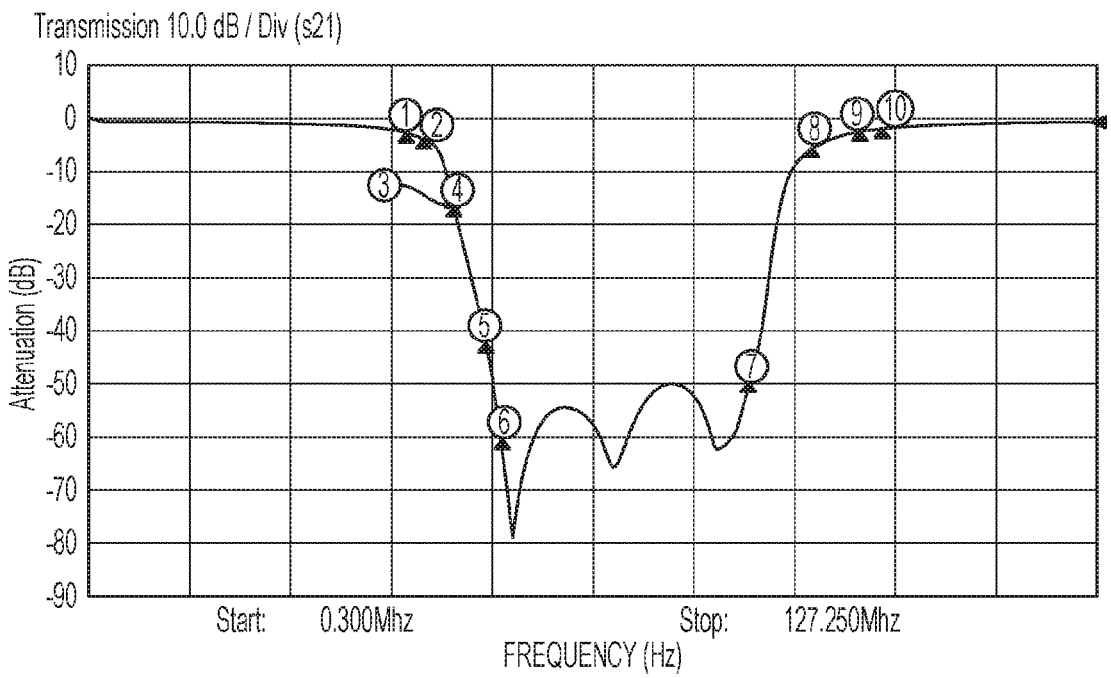
FIG. 2 exemplifies one aspect of the performance of the converter filter of FIG. 1.
Figure 3:
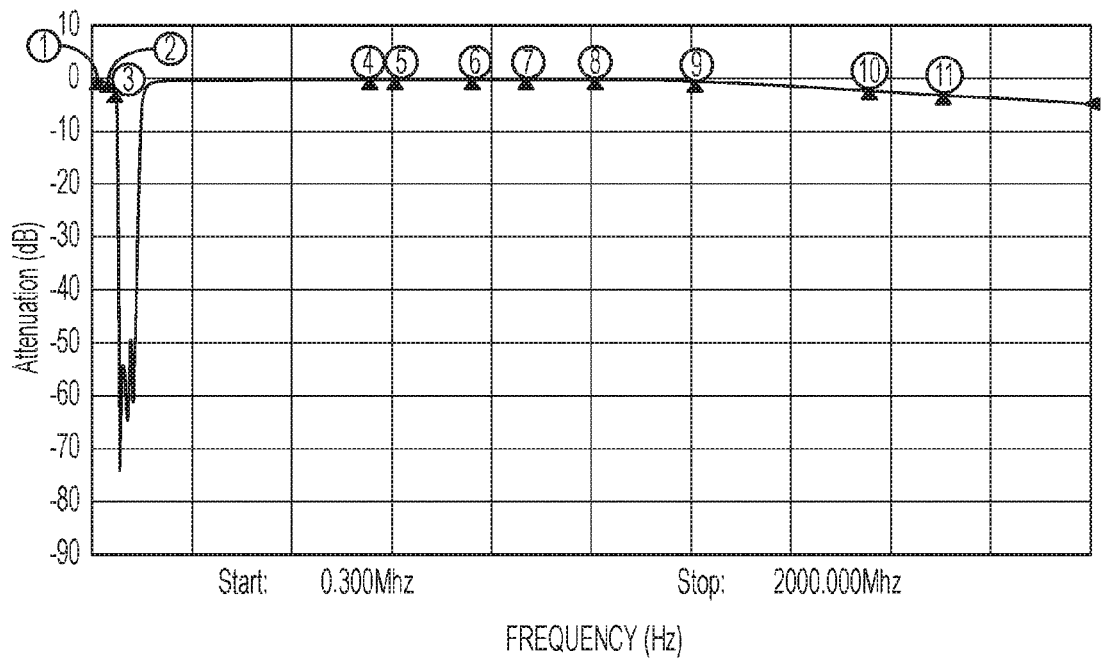
FIG. 3 exemplifies another aspect of the performance of the converter filter of FIG. 1.
Figure 4:
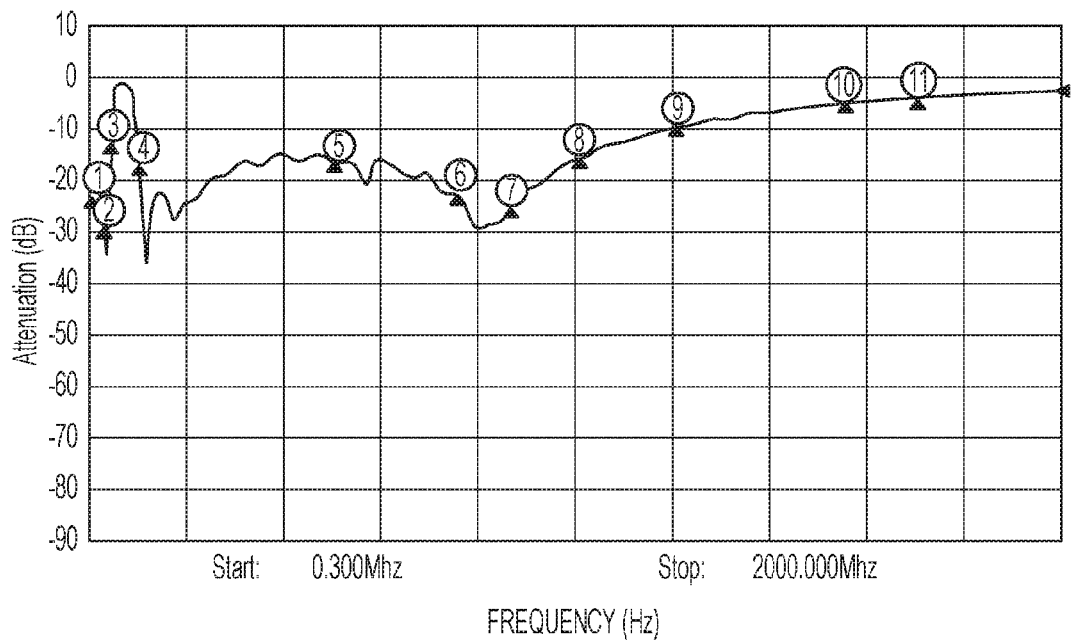
FIG. 4 exemplifies another aspect of the performance of the converter filter of FIG. 1.

Referring to the drawings in detail, and specifically to FIG. 1, reference numeral 10 generally designates an exemplary converter filter having a low pass portion and a high pass portion in accordance with an embodiment of the present invention. Communications enter the converter filter at the input node 1 and go to the legacy converter boxes (or other such similar devices) by exiting the circuit 10 at the output node 2. The converter filter 10 includes a circuit comprising a return path low pass filter portion 14 and a downstream path high pass filter portion 16. The low pass filter portion comprises capacitors C2, C4, and C6, a plurality of inductors L1, L2, L3, L4, and L5 as well as a plurality capacitors C1, C3, C5, and C7. The high pass filter portion comprises a plurality of inductors L6, L7, L8, L9, L11 and L12 as well as a plurality of capacitors C8, C9, C10, C11, C12, C13, C14, C15, C16, C17, C18, C19, and C20. Each of the inductors and capacitors of the converter filter 10 operate in conjunction with each other to substantially pass signals in a first frequency band and a second frequency band and to substantially block signals in a third frequency band. The performance of the circuit of FIG. 1 is shown in FIGS. 2, 3 and 4, which illustrate the specific frequencies being filtered. Note that this filter circuit as well as all other filter circuits described herein, being passive circuits, operate bidirectionally wherein inputs and outputs can be reversed without any change in circuit performance.

Figure 5:
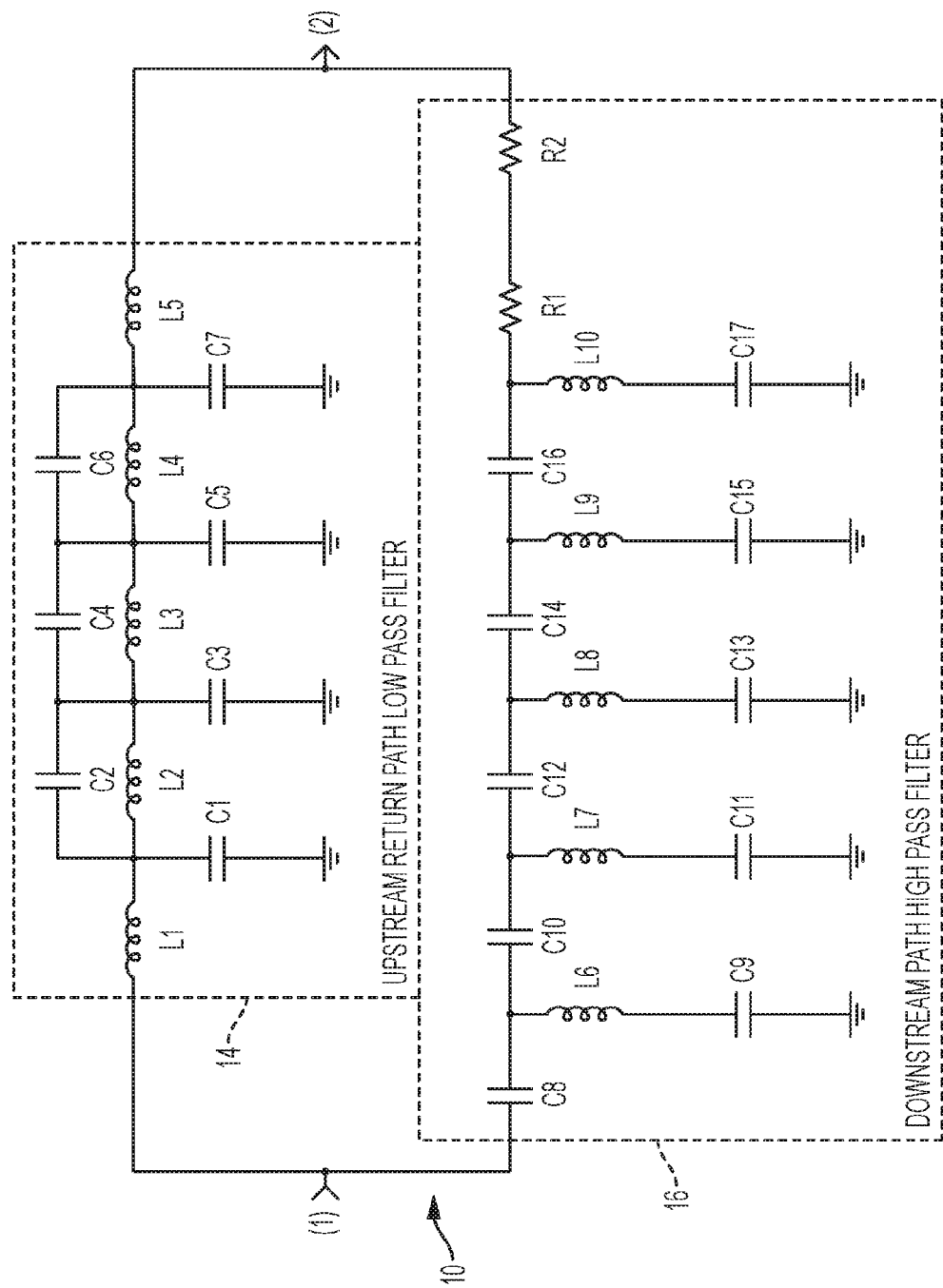
FIG. 5 illustrates a second embodiment of the converter filter.
Figure 6:
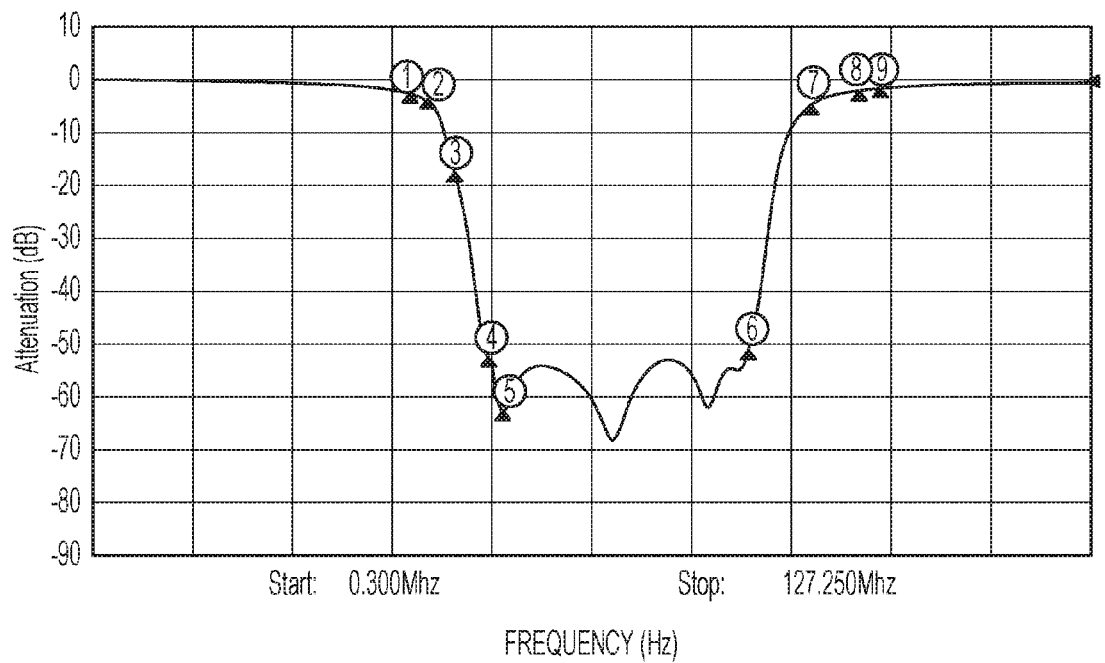
FIG. 6 exemplifies one aspect of the performance of the converter filter of FIG. 5.
Figure 7:
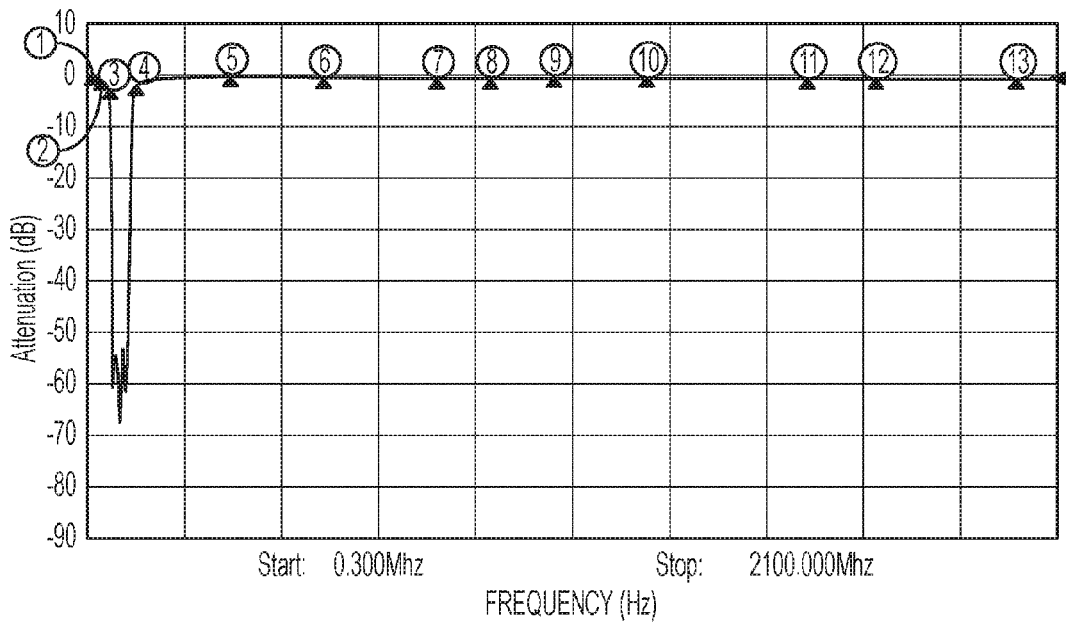
FIG. 7 exemplifies another aspect of the performance of the converter filter of FIG. 5.
Figure 8:
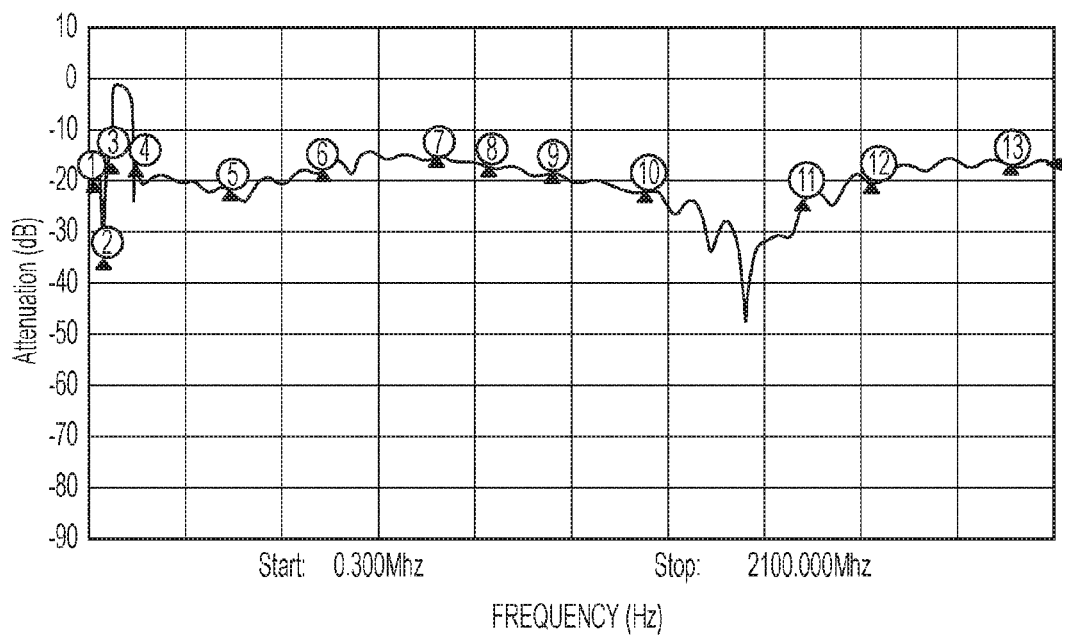
FIG. 8 exemplifies another aspect of the performance of the converter filter of FIG. 5.

FIG. 5 illustrates a second embodiment of the converter filter 10. The performance of the circuit of FIG. 2 is shown in FIGS. 6, 7 and 8. It is noted that the embodiment of the circuit 10 of FIG. 5 removes capacitors C18, C19, C20 and choke L11 and replaces them with two series resistors R1 and R2, which may be combined to a single series resistor R3 (not shown). It should be understood that a preferable range of values for R1 and R2 is from 0 to 10 Ohms each, e.g., R1=0 Ohms and R2=2.7 Ohms or the equivalent thereof.

It is noted that the performance of the circuit of FIG. 5 is improved over that of the embodiment shown in FIG. 1. In particular, the passband response shown in FIG. 7 as compared to that of FIG. 3 now extends out to 2 GHz and, for example, at 1700 MHz provides an almost 3 dB improvement. Considering the return loss performance shown in FIGS. 4 and 8, the second embodiment circuit provides a nearly 15 dB improvement at 1700 MHz.

Going from the circuit of FIG. 1 to that of FIG. 5 is achieved by replacing three capacitors and a choke inductor with a series resistance. An advantage of the circuit of FIG. 5 is that resistors are far less expensive than capacitors and choke inductors. The insertion of a series resistance into the circuit results in better matching of the passband and removing the other elements C18, C19, C20 and L11 improves the performance in the passband. In particular, replacing the capacitor C20 with a series resistance improves the performance in the higher end of the frequency range. Replacing C20 with an inductor to match improves the performance in the lower frequencies. Thus, the improved circuit of FIG. 5 functions to extend the passband and improve circuit performance along with achieving a reduction in parts and related bill of material cost reduction.

As an example, nominal values for the components in the circuits of FIGS. 1 and 5 are as presented below in Table 1:

TABLE 1

| L1 | .22 µH | C1 | 56 pF |
| L2 | .24 µH | C2 | 24 pF |
| L3 | .22 µH | C3 | 56 pF |
| L4 | .13 µH | C4 | 39 pF |
| L5 | .30 µH | C5 | 47 pF |
| L6 | 82 nH | C6 | 68 pF |
| L7 | 160 nH | C7 | 47 pF |
| L8 | 200 nH | C8 | 22 pF |
| L9 | 220 nH | C9 | 100 pF |
| L10 | 270 nH | C10 | 24 pF |
|  |  | C11 | 20 pF |
|  |  | C12 | 39 pF |
|  |  | C13 | 15 pF |
|  |  | C14 | 51 pF |
|  |  | C15 | 13 pF |
| R1 | 0 Ω | C16 | 30 pF |
| R2 | 2.7 Ω | C17 | 15 pF |

Figure 9:
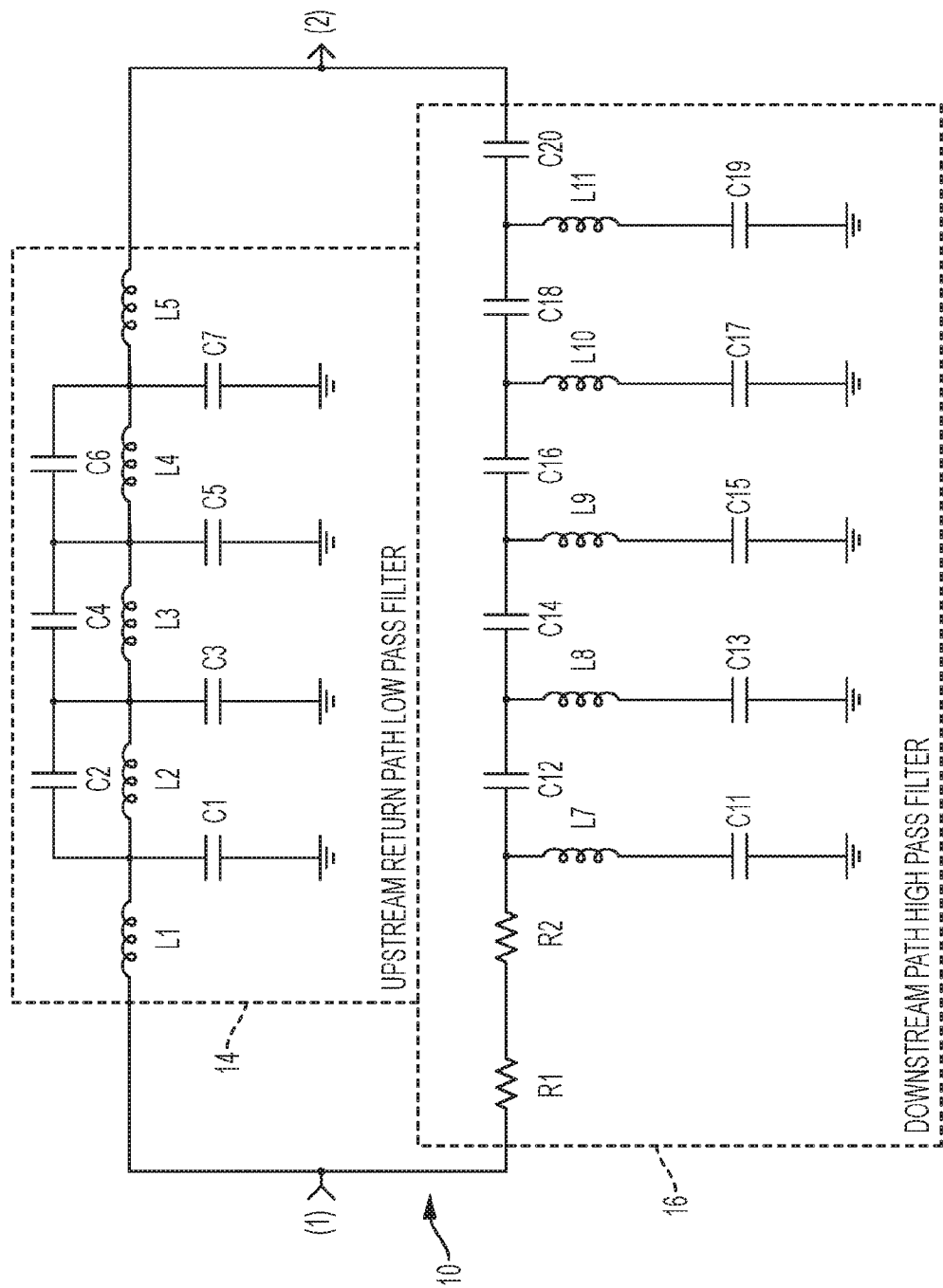
FIG. 9 illustrates another embodiment of the converter filter.

Referring now to FIG. 9, what is disclosed is a filter circuit similar to that of the embodiment of FIG. 5 with capacitors C8, C9, C10 and choke L6 replaced with resistors R1 and R2 (i.e. the components on the input side of the circuit rather than the output side).

Figure 10:
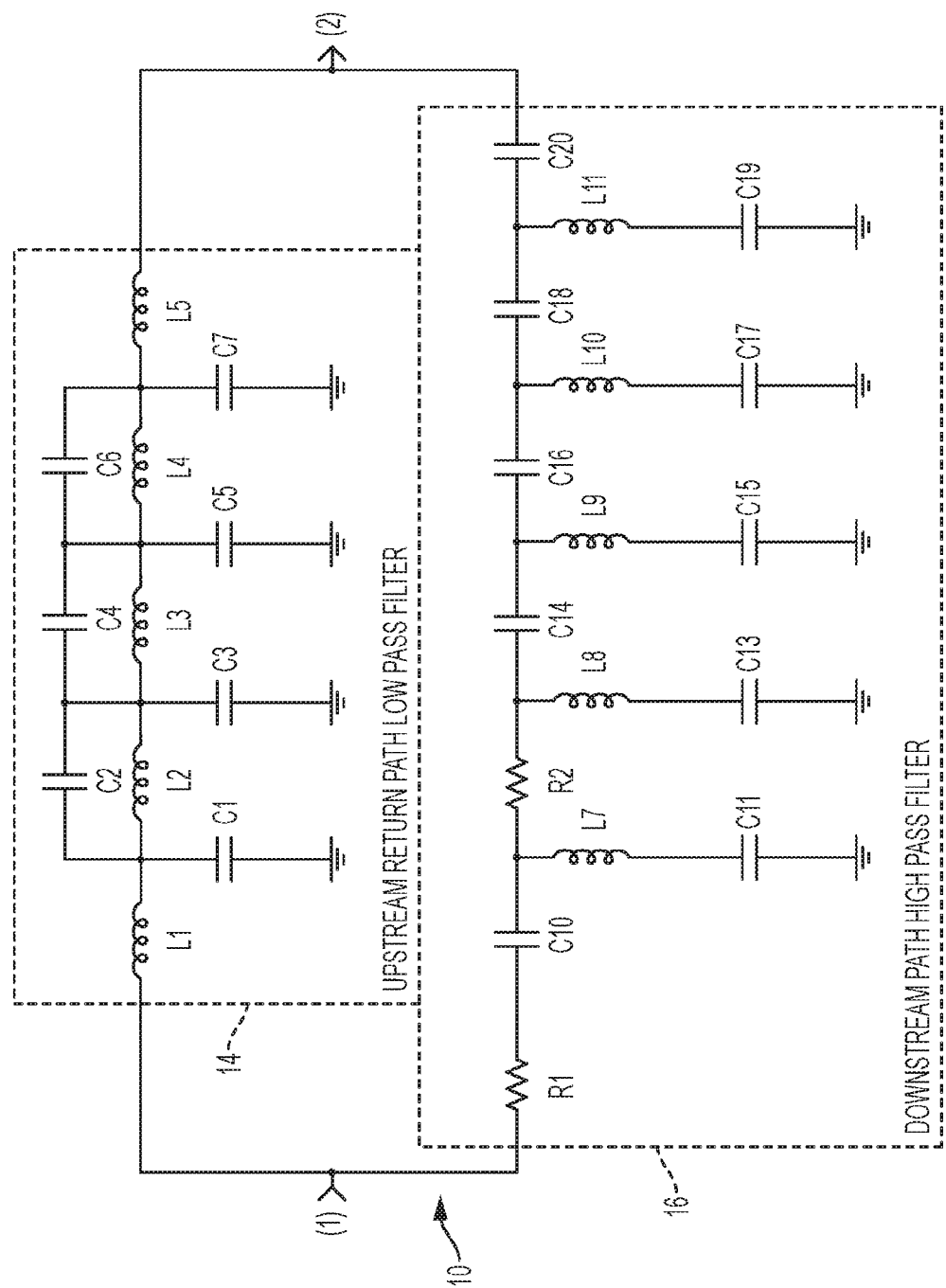
FIG. 10 illustrates another embodiment of the converter filter.
Figure 11:
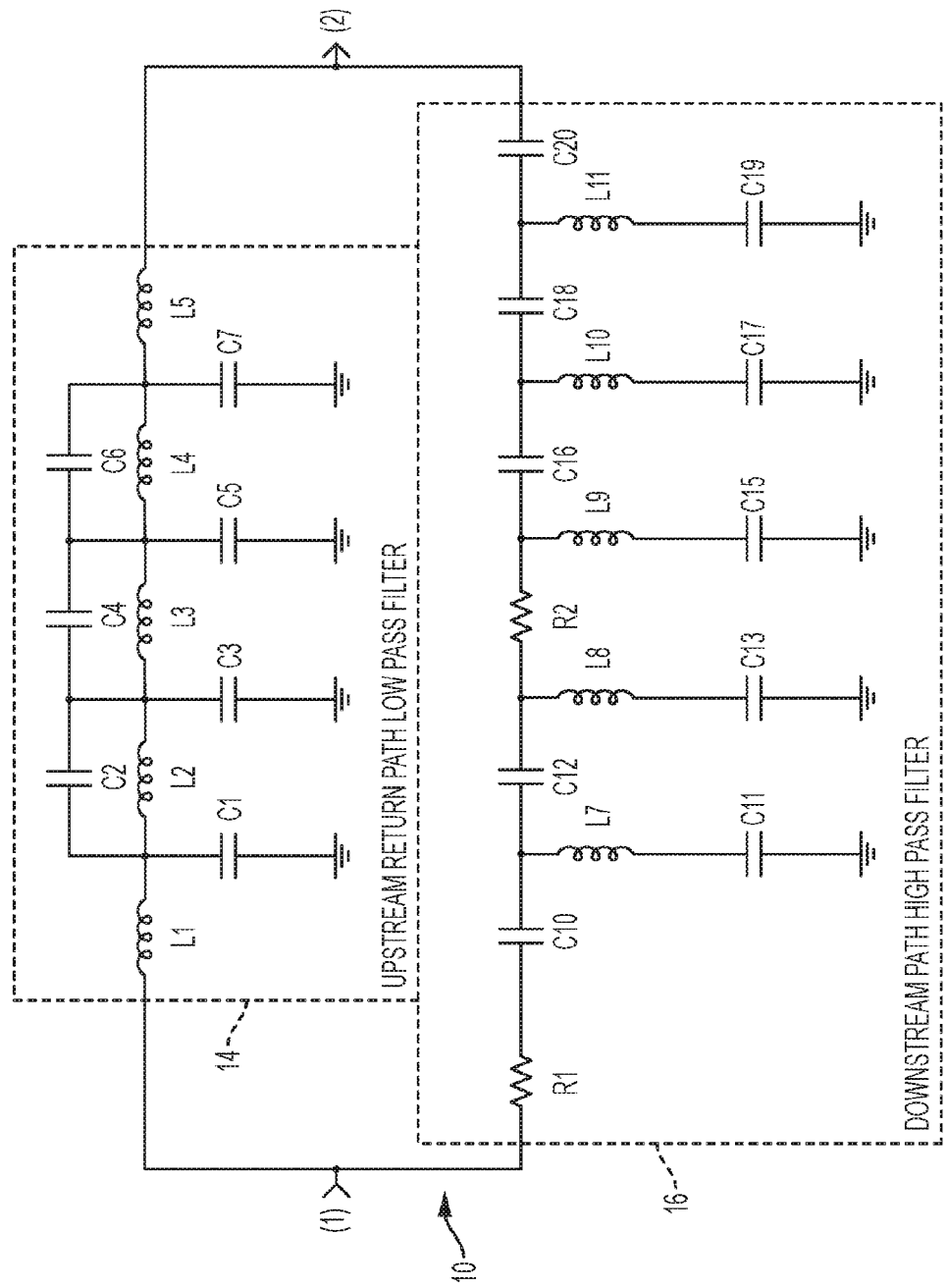
FIG. 11 illustrates another embodiment of the converter filter.
Figure 12:
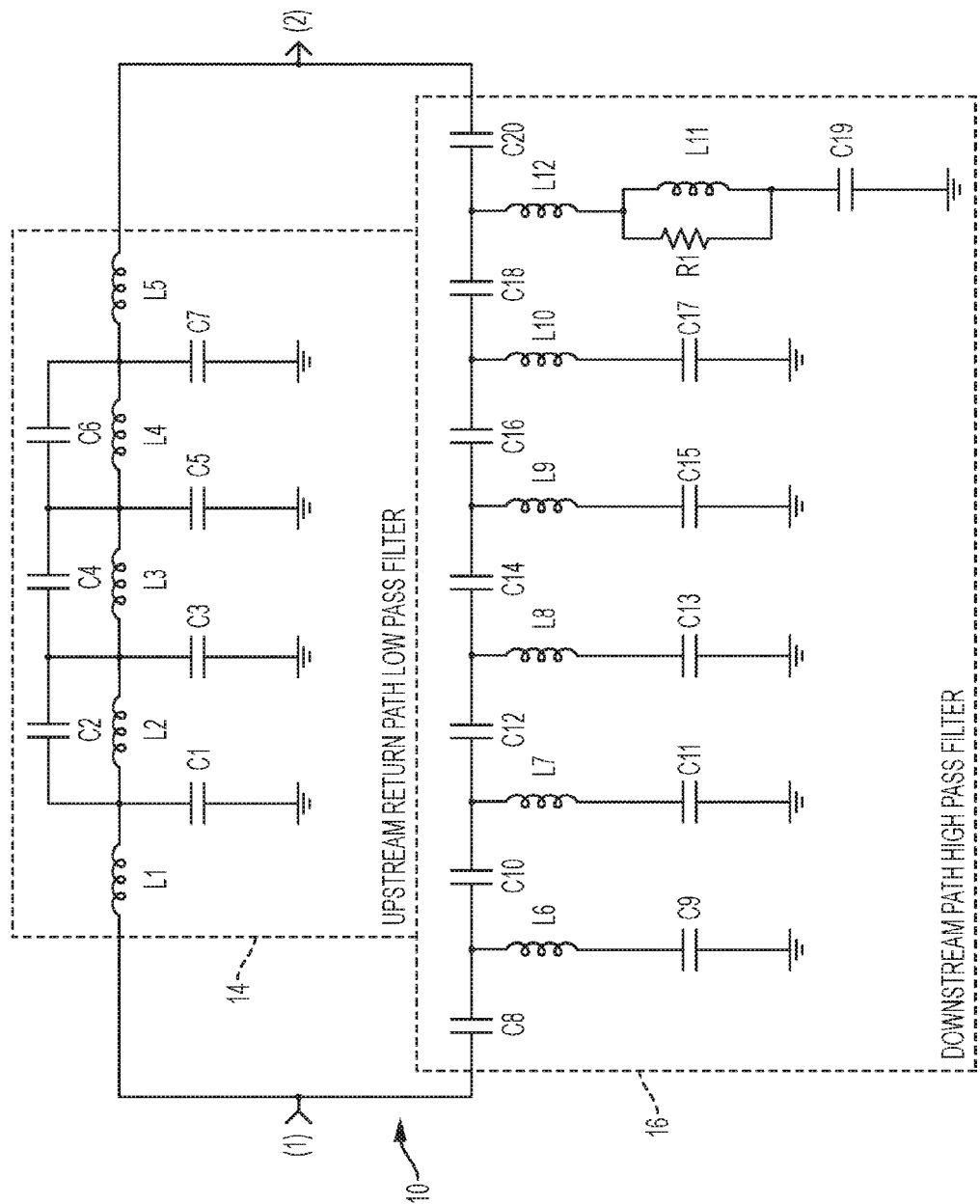
FIG. 12 illustrates another embodiment of the converter filter.
Figure 13:
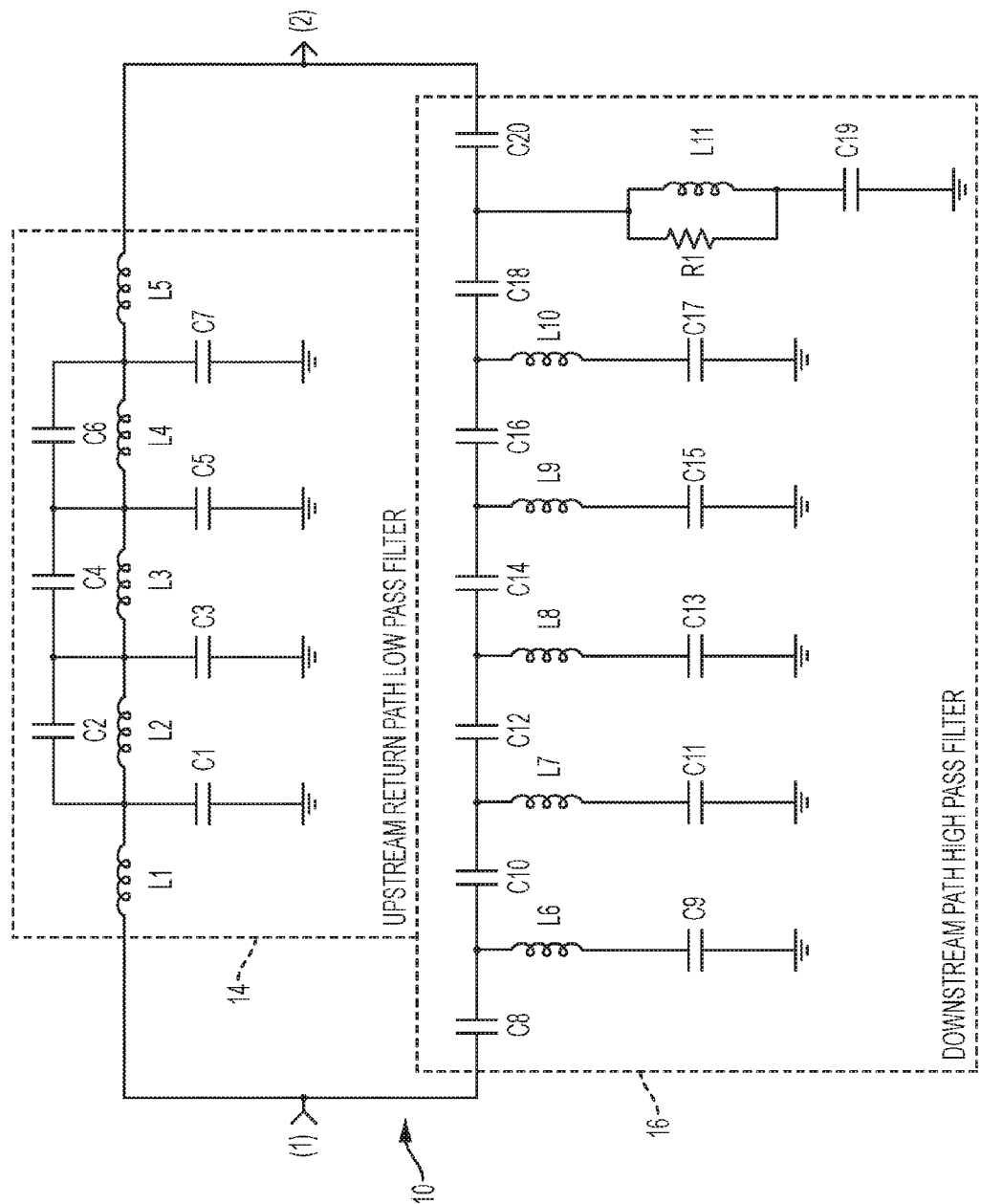
FIG. 13 illustrates another embodiment of the converter filter.

FIG. 10 shows an alternative embodiment of the filter circuit with capacitor C12 removed rather than C10. FIG. 11 shows an alternative embodiment of the filter circuit, with capacitor C14 removed rather than C10. FIG. 12 shows an alternative embodiment of the filter circuit with resistor R1 added to the circuit, in parallel with choke L11, and choke L12 added to the circuit. FIG. 13 shows an alternative embodiment of the filter circuit with resistor R1 added to the circuit in parallel with choke L11.

Figure 14:
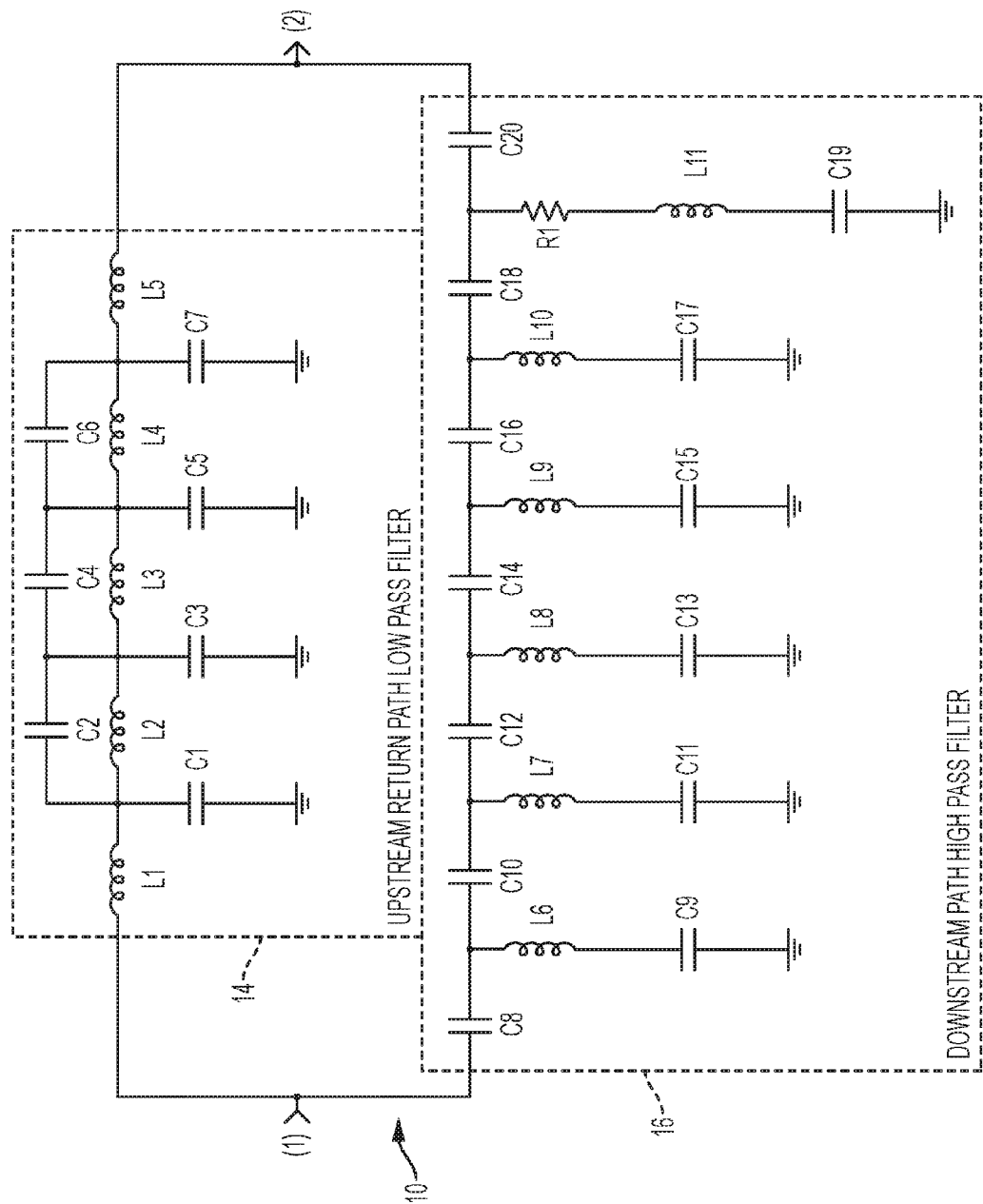
FIG. 14 illustrates another embodiment of the converter filter.
Figure 15:
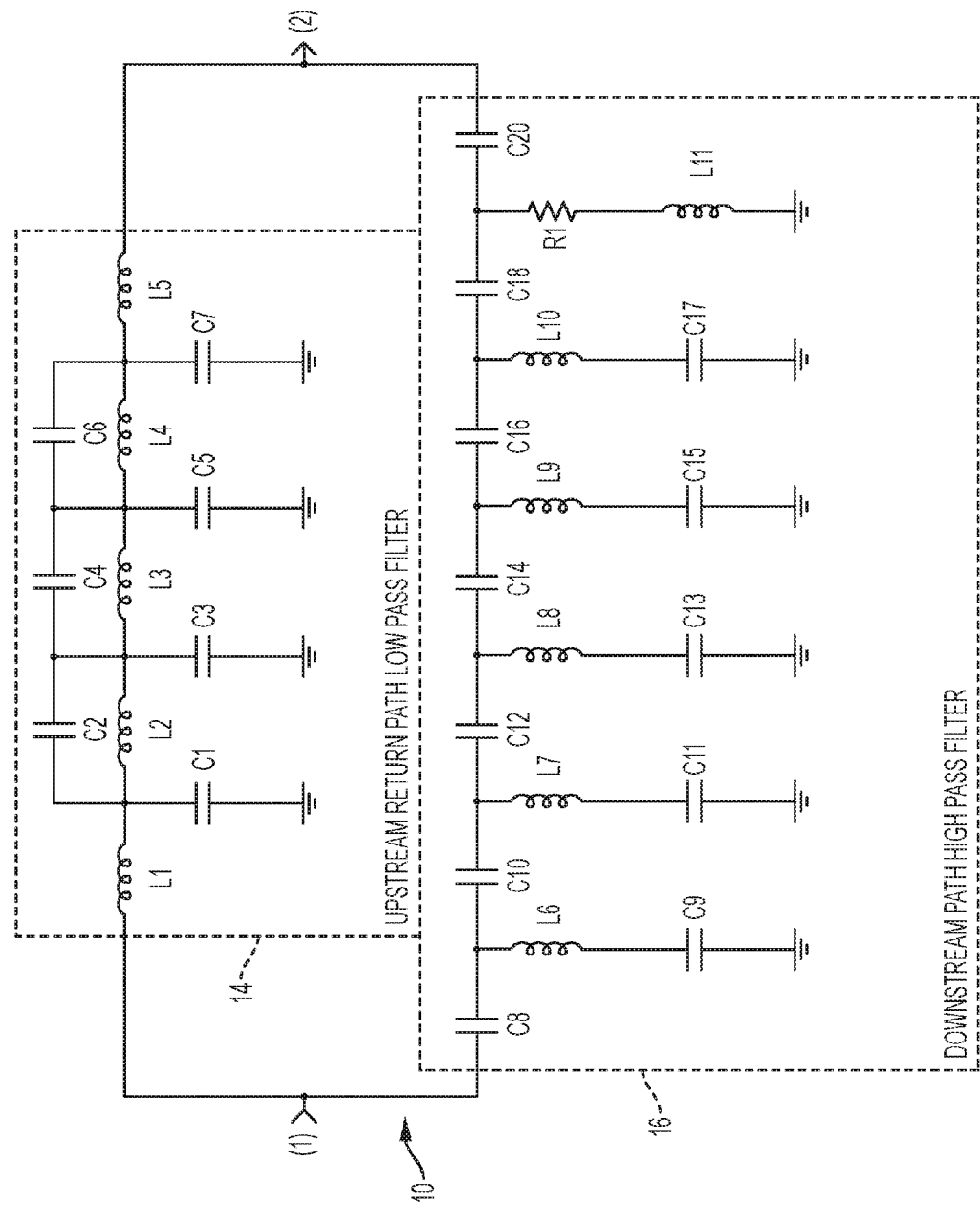
FIG. 15 illustrates another embodiment of the converter filter.
Figure 16:
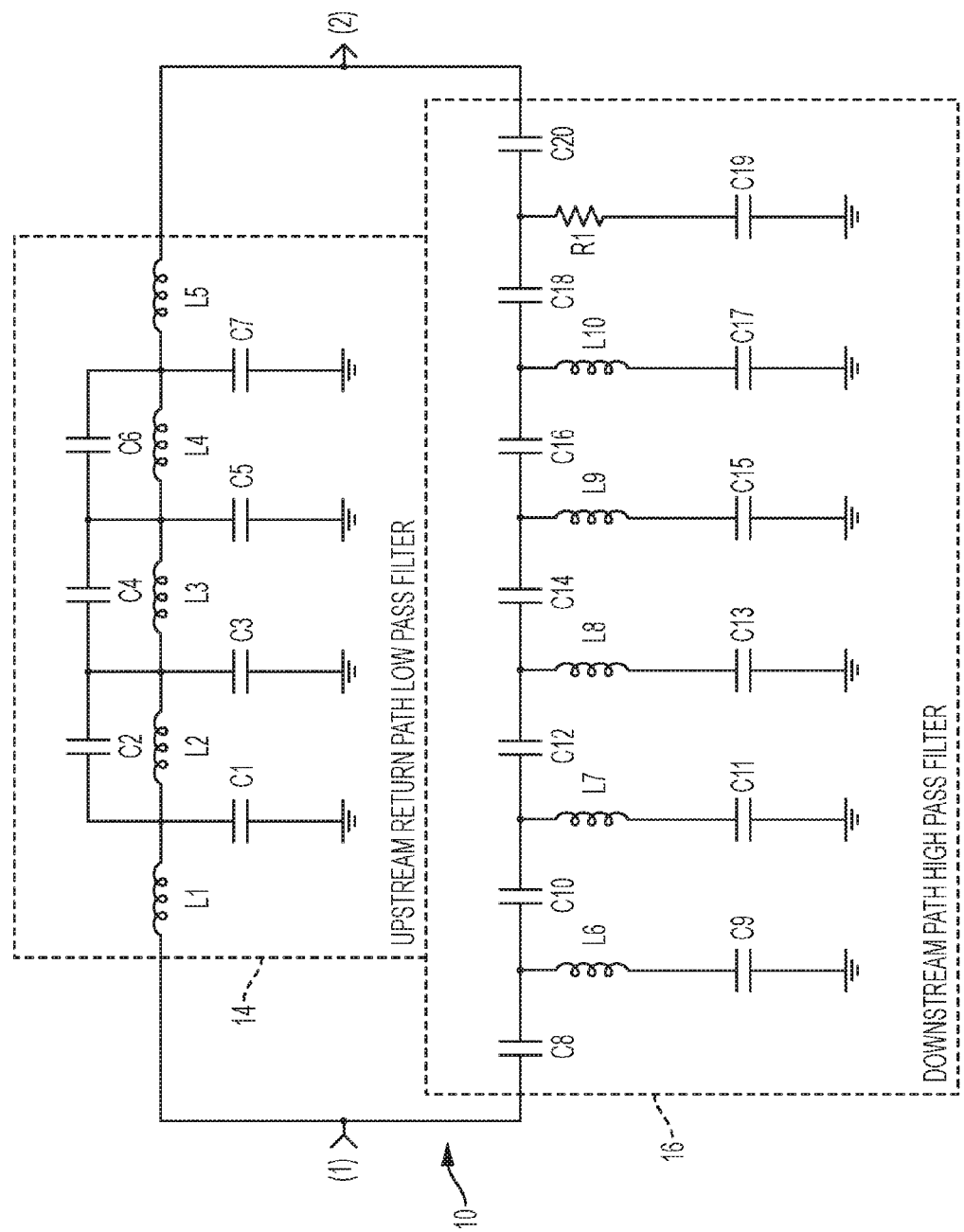
FIG. 16 illustrates another embodiment of the converter filter.
Figure 17:
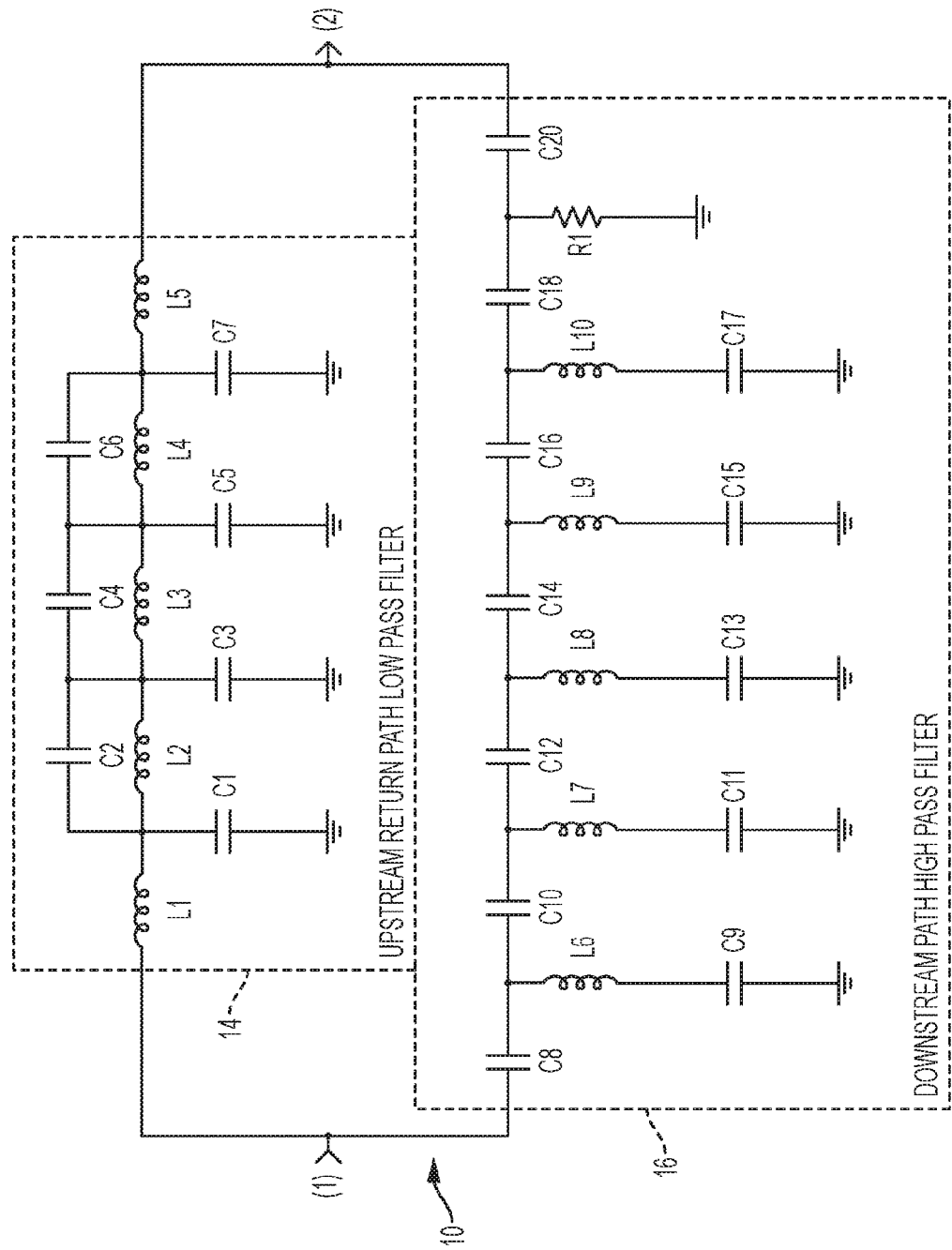
FIG. 17 illustrates another embodiment of the converter filter.
Figure 18:
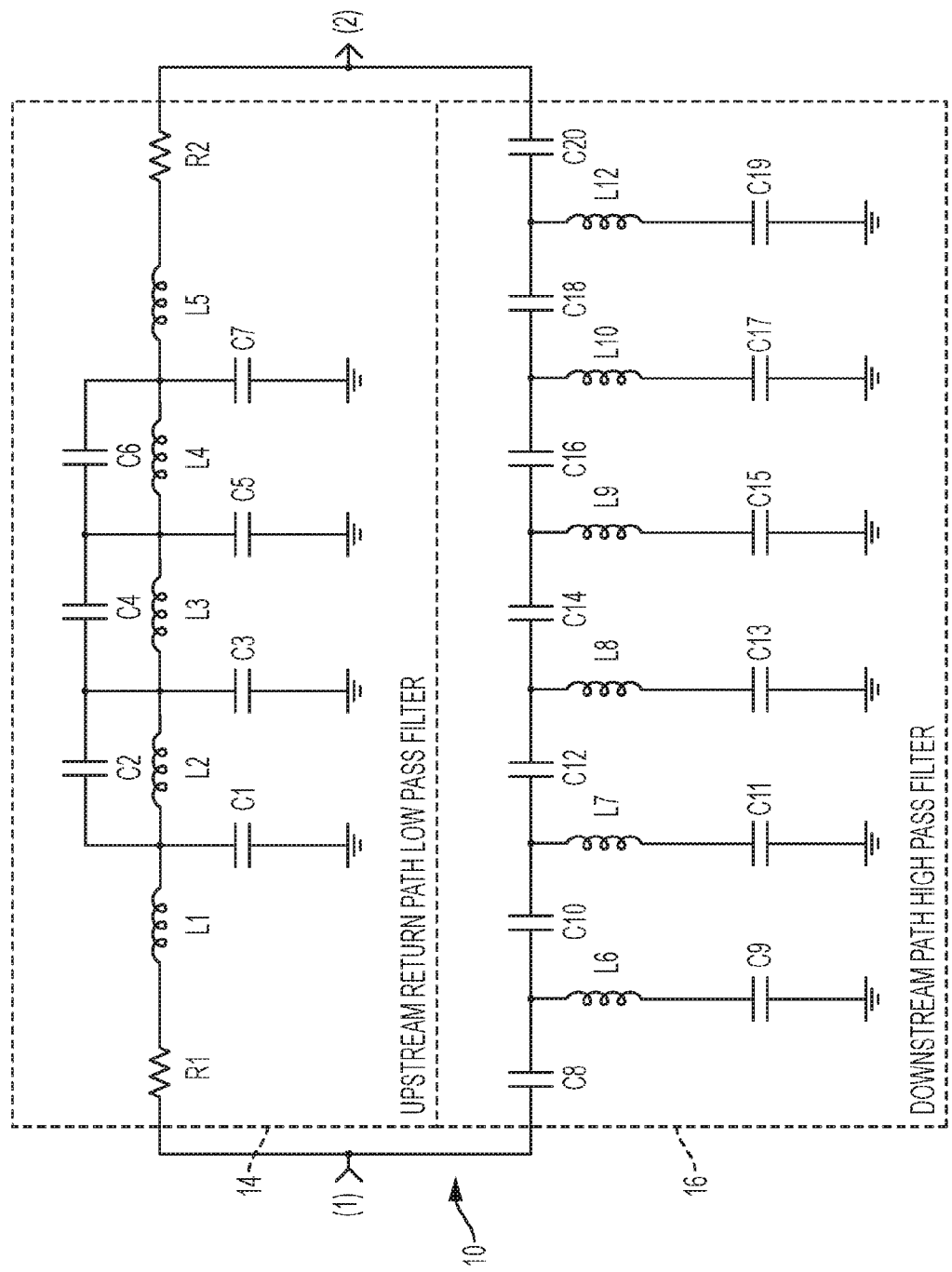
FIG. 18 illustrates another embodiment of the converter filter.
Figure 19:
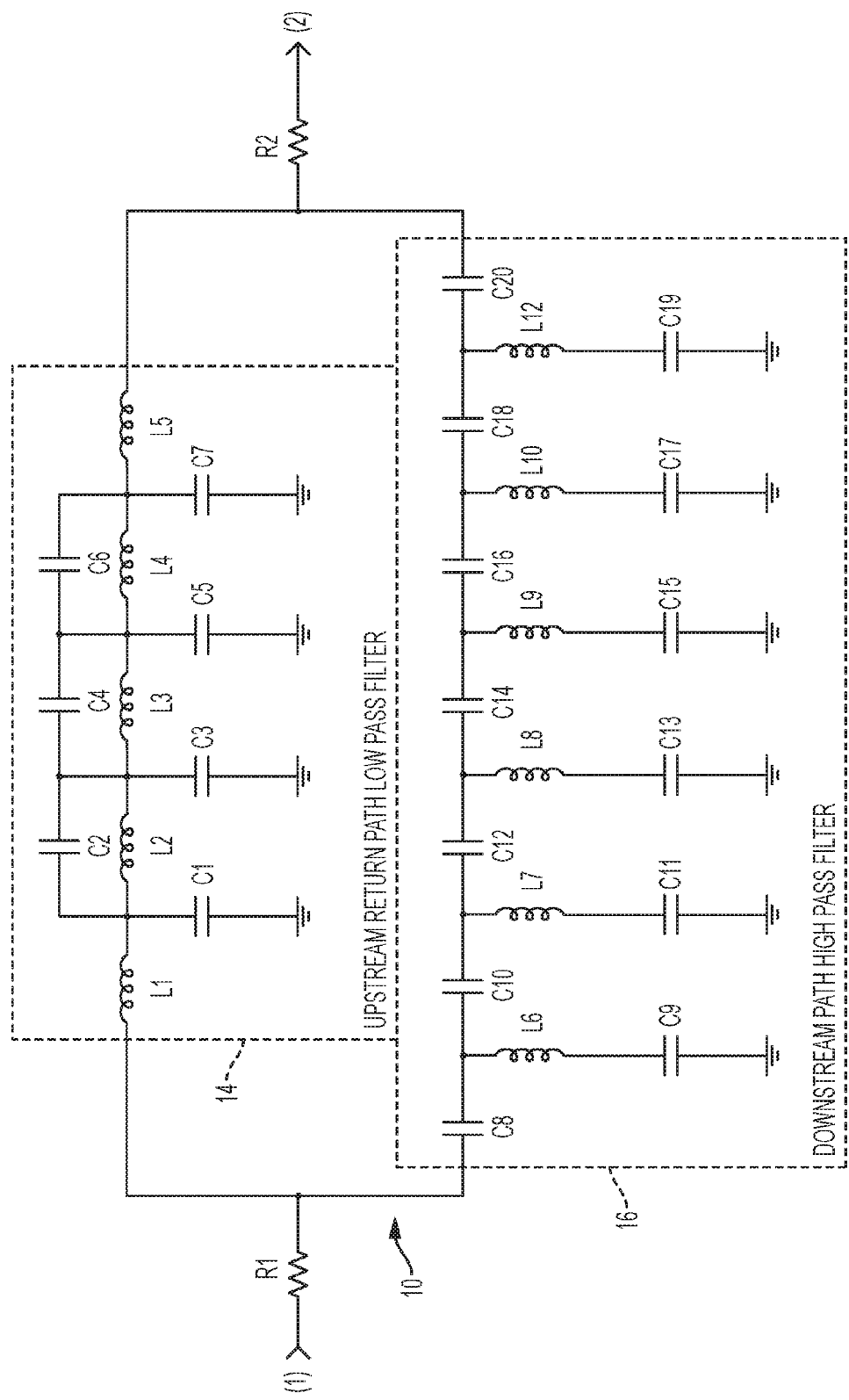
FIG. 19 illustrates another embodiment of the converter filter.
Figure 20:
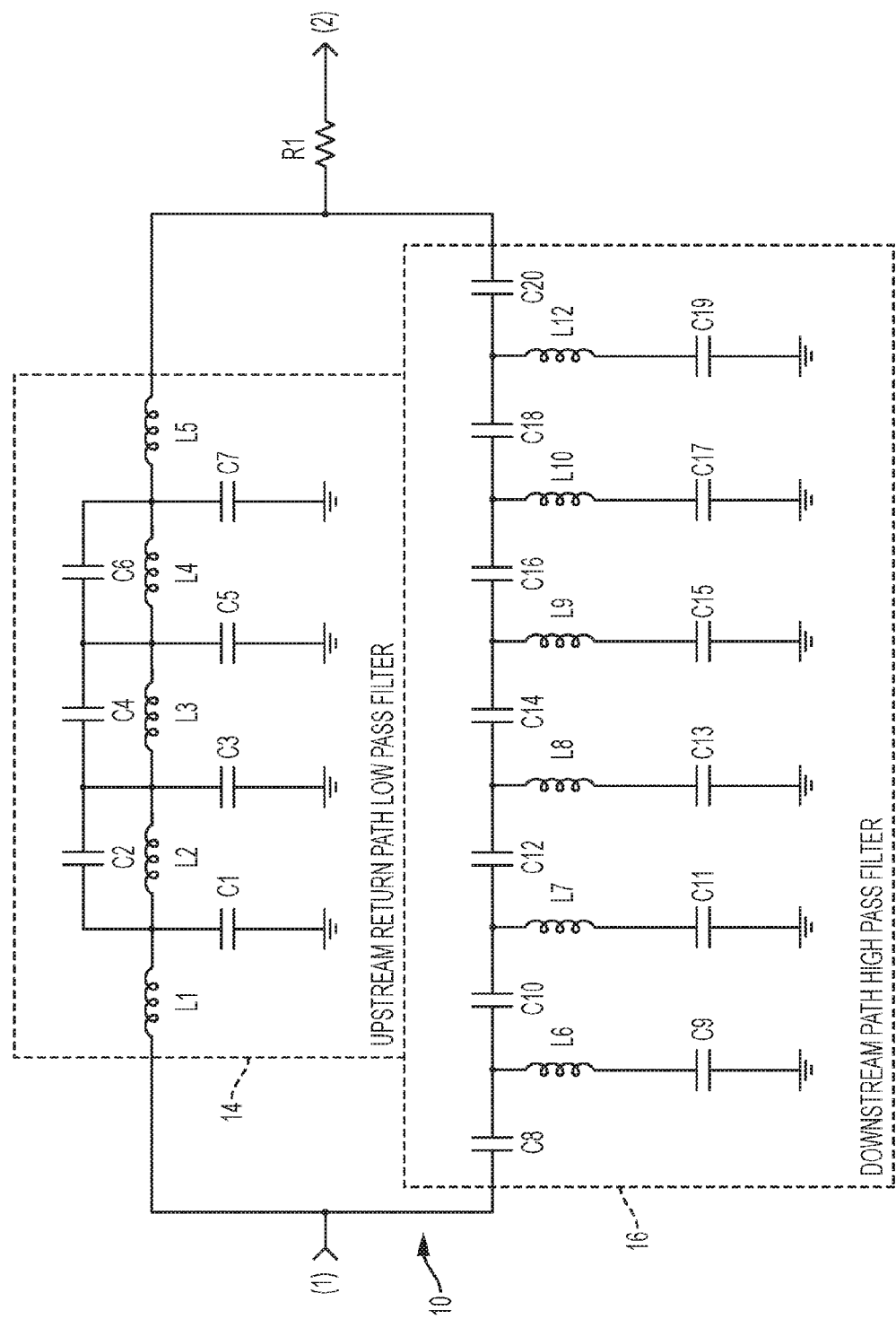
FIG. 20 illustrates another embodiment of the converter filter.

FIG. 14 shows an alternative filter circuit, with resistor R1 added to the circuit in series with choke L11 and capacitor C19. FIG. 15 shows an alternative embodiment of the filter circuit with resistor R1 added to the circuit in series with choke L11 and capacitor C19 removed. FIG. 16 shows an alternative embodiment of the filter circuit, with resistor R1 added to the circuit in series with capacitor C19 and choke L11 removed. FIG. 17 shows an alternative embodiment of the filter circuit, with capacitor C19 and choke L11 replaced with resistor R1. FIG. 18 shows an alternative embodiment of the filter circuit, with resistors R1 and R2 added to the low pass filter instead of the high pass filter. FIG. 19 shows an alternative embodiment of the filter circuit, with resistors R1 and R2 added to the input and output of the converter filter. FIG. 20 shows an alternative filter circuit, with resistor R1 added to the output of the converter filter.

Although the invention has been described with reference to preferred embodiments thereof, it is understood that various modifications may be made thereto without departing from the full spirit and scope of the invention as defined by the claims which follow.

What is claimed is:

1. A CATV converter filter, comprising:
    a circuit comprising:
        a input node operative to receive an input signal having frequencies in a predetermined radio frequency (RF) range that includes a first frequency and a second frequency;
        an output node operative to receive an output signal comprising a filtered version of said input signal;
        a low pass filter connected between said input node and said output node and having first components operative to substantially pass signals below said first frequency and to substantially block signals above said first frequency;
        a high pass filter in parallel with said low pass filter and connected between said input node and said output node and having second components operative to substantially pass signals above said second frequency and to substantially block signals below said second frequency;
        a resistance having a predetermined value in series with said low pass filter; and
        wherein said second frequency is higher than said first frequency thereby creating a bandstop range of frequencies that substantially blocks signals between said first frequency and said second frequency.

2. The CATV converter filter according to claim 1, wherein said circuit comprises a plurality of capacitors operating in parallel with a plurality of inductors.

3. The CATV converter filter according to claim 1, wherein said low pass filter comprises a plurality of inductors connected in series, a first set of capacitors connected in parallel to one or more of said inductors, a second set of capacitors connected between said inductors and ground, and said resistance in series with said plurality of inductors.

4. The CATV converter filter according to claim 1, wherein said high pass filter comprises a plurality of first capacitors connected in series, pairs of inductors and second capacitors connected in series between said first capacitors and ground and said resistance connected in series with said plurality of first capacitors.

5. The CATV converter filter according to claim 1, wherein said high pass filter comprises:
    a first set of capacitors operatively connected to a second set of capacitors and each capacitor of the first set of capacitors being connected in series to an inductor and ground;
    a resistor operatively connected in series with said first set of capacitors.

6. The CATV converter filter according to claim 1, wherein said high pass filter comprises:
    a first set of capacitors operatively connected to a second set of capacitors and each capacitor of the first set of capacitors being connected in series to an inductor and ground;
    a plurality of resistors operatively connected in series with said first set of capacitors and
    wherein said plurality of resistors has a total resistance between 1 and 10 ohms.

7. The CATV converter filter according to claim 1, wherein said high pass filter comprises:
    a first set of capacitors operatively connected to a second set of capacitors and each capacitor of the first set of capacitors being connected in series to an inductor and ground; and
    wherein at least one capacitor of the first set of capacitors is configured to be in parallel with an inductor.

8. The CATV converter filter according to claim 1, wherein said high pass filter comprises:
    a first set of capacitors operatively connected to a second set of capacitors and each capacitor of the first set of capacitors being connected in series to an inductor and ground; and
    wherein at least one capacitor of the first set of capacitors is further in series with said resistance in parallel with an inductor.

9. The CATV converter filter according to claim 1, wherein said high pass filter comprises:
    a first set of capacitors operatively connected to a second set of capacitors and each capacitor of the first set of capacitors being connected in series to an inductor and ground; and
    wherein at least one capacitor of the first set of capacitors is only in series with said resistance in parallel with an inductor.

10. The CATV converter filter according to claim 1, wherein said resistance is located at the input and the output of the CATV converter filter.

11. The CATV converter filter according to claim 1, wherein said resistance is located at the output of the CATV converter filter.

12. A CATV converter filter, comprising
    a input node operative to receive an input signal having frequencies in a predetermined radio frequency (RF) range that includes a first frequency and a second frequency;
    an output node operative to receive an output signal comprising a filtered version of said input signal;
    a low pass filter connected between said input node and said output node and having first components operative to substantially pass signals below said first frequency and to substantially block signals above said first frequency;
    a high pass filter connected between said input node and said output node, in parallel with said low pass filter, and having second components operative to substantially pass signals above said second frequency and to substantially block signals below said second frequency;
    a resistance having a predetermined value in series with one of said low pass filter, said high pass filter, and said parallel combination of said low pass filter and said high pass filter; and
    wherein said second frequency is higher than said first frequency thereby creating a bandstop range of frequencies that substantially blocks signals between said first frequency and said second frequency.

13. The CATV converter filter according to claim 12, wherein said series resistance has a value of approximately 2.7 ohms.

14. The CATV converter filter according to claim 12, wherein said first frequency is approximately 52 MHz.

15. The CATV converter filter according to claim 12, wherein said second frequency is approximately 85 MHz.

16. The CATV converter filter according to claim 12, wherein said first components and said second components comprise a plurality of capacitors and inductors.

17. A method of filtering a CATV signal, the method comprising:
   connecting a first plurality of electronic components to form a low pass filter connected between an input node and an out node, said input node operative to receive an input signal having frequencies in a predetermined radio frequency (RF) range that includes a first frequency and a second frequency, said output node operative to receive an output signal comprising a filtered version of said input signal;
   low pass filtering, using said low pass filter, said input signal to substantially pass signals below said first frequency and to substantially block signals above said first frequency;
   connecting a second plurality of electronic components to form a high pass filter connected between said input node and said output node, in parallel with said low pass filter;
   high pass filtering, using said high pass filter, said input signal to substantially pass signals above said second frequency and to substantially block signals below said second frequency;
   providing a resistance having a predetermined value in series with one of said low pass filter, said high pass filter, and said parallel combination of said low pass filter and said high pass filter; and
   wherein said second frequency is higher than said first frequency thereby creating a bandstop range of frequencies that substantially blocks signals between said first frequency and said second frequency.

18. The method according to claim 17, wherein said series resistance has a value of approximately 2.7 ohms.

19. The method according to claim 17, wherein said first frequency is approximately 52 MHz.

20. The method according to claim 17, wherein said second frequency is approximately 85 MHz.

21. The method according to claim 17, wherein said first components and said second components comprise a plurality of capacitors and inductors.

\* \* \* \* \*